US011264092B2

(12) United States Patent
Chang et al.

(10) Patent No.: US 11,264,092 B2
(45) Date of Patent: Mar. 1, 2022

(54) NON-VOLATILE MEMORY WITH MULTI-LEVEL CELL ARRAY AND ASSOCIATED READ CONTROL METHOD

(71) Applicant: eMemory Technology Inc., Hsin-Chu (TW)

(72) Inventors: Chia-Fu Chang, Hsinchu County (TW); Wei-Ming Ku, Hsinchu County (TW); Hung-Yi Liao, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 16/989,929

(22) Filed: Aug. 11, 2020

(65) Prior Publication Data
US 2021/0358543 A1 Nov. 18, 2021

(30) Foreign Application Priority Data

May 12, 2020 (TW) .................................. 109115665

(51) Int. Cl.
*G11C 17/00* (2006.01)
*G11C 11/56* (2006.01)
*G11C 17/16* (2006.01)
*G11C 17/18* (2006.01)

(52) U.S. Cl.
CPC .......... *G11C 11/5692* (2013.01); *G11C 17/16* (2013.01); *G11C 17/18* (2013.01)

(58) Field of Classification Search
CPC .............................. G11C 11/5692; G11C 17/18
See application file for complete search history.

(56) References Cited

U.S. PATENT DOCUMENTS

| 5,943,259 | A  | * | 8/1999  | Choi ................... G11C 11/5621 365/185.03 |
| 6,456,527 | B1 |   | 9/2002  | Campardo et al. |
| 2004/0047179 | A1 |   | 3/2004  | Tanizaki et al. |
| 2008/0158935 | A1 | * | 7/2008  | Taguchi ............. G11C 13/0007 365/148 |
| 2014/0185401 | A1 | * | 7/2014  | Yang ........................ G11C 7/14 365/207 |
| 2014/0355353 | A1 | * | 12/2014 | Tsai ........................ G11C 16/28 365/185.21 |
| 2017/0365336 | A1 |   | 12/2017 | Lin et al. |

FOREIGN PATENT DOCUMENTS

EP          1071094 A1      1/2001

OTHER PUBLICATIONS

Search report issued by EPO dated Mar. 12, 2021.

* cited by examiner

*Primary Examiner* — Uyen Smet
(74) *Attorney, Agent, or Firm* — WPAT, PC (57) ABSTRACT

A non-volatile memory includes a cell array, a current supply circuit, a path selecting circuit and a judging circuit. The cell array includes plural multi-level memory cells in an m×n array. The cell array is connected with m word lines and n lines. The current supply circuit provides one of plural reference currents according to a current control value. The path selecting circuit is connected with the current supply circuit and the n bit lines. The judging circuit is connected with the path selecting circuit, and generates n output data. A first path selector of the path selecting circuit is connected with a path selecting circuit and a first bit line. A first judging device of the judging circuit is connected with the first path selector and generates a first output data.

10 Claims, 10 Drawing Sheets

NON-VOLATILE MEMORY WITH MULTI-LEVEL CELL ARRAY AND ASSOCIATED READ CONTROL METHOD

This application claims the benefit of Taiwan application Serial No. 109115665, filed May 12, 2020, the subject matters of which are incorporated herein by reference.

FIELD OF THE INVENTION

The present invention relates to a non-volatile memory and an associated control method, and more particularly to a non-volatile memory with a multi-level cell array and an associated read control method.

BACKGROUND OF THE INVENTION

As is well known, a non-volatile memory is able to continuously retain data after the supplied power is interrupted. Consequently, the non-volatile memory is widely applied to a variety of electronic devices. Generally, the non-volatile memories are classified into a one-time programmable non-volatile memory (also referred as an OTP non-volatile memory) and a multi-time programmable non-volatile memory (also referred as MTP non-volatile memory). The memory cells of the OTP non-volatile memory are OTP memory cells. The memory cells of the MTP non-volatile memory are MTP memory cells.

According to the stored data amount, the memory cells are classified into single-level memory cells and multi-level memory cells. Generally, one single-level memory cell is able to store a 1-bit data. That is, the data indicates a first storage state or a second storage state. Moreover, one multi-level memory cell is able to store a data with at least two bits.

For example, if the multi-level memory cell is able to store a 2-bit data, the data of the memory cell indicates one of a first storage state, a second storage state, a third storage state and a fourth storage state. Similarly, if the multi-level memory cell is able to store a 3-bit data, the multi-level memory cell has eight ($=2^3$) storage states. Similarly, if the multi-level memory cell is able to store a 4-bit data, the multi-level memory cell has sixteen ($=2^4$) storage states. Hereinafter, the circuitry structures of some types of non-volatile memory cells will be illustrated with reference to FIGS. 1A~1E.

Figure 1A:
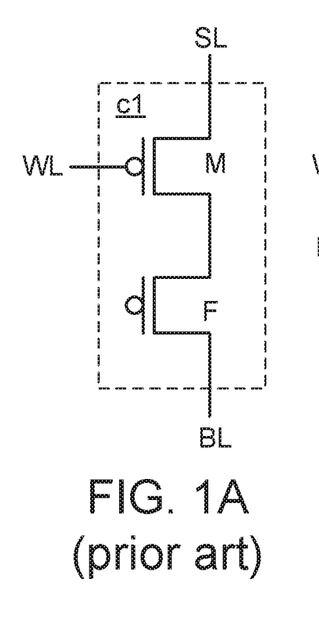
FIGS. 1A~1E (prior art) are schematic circuit diagrams illustrating some types of non-volatile memory cells.

FIG. 1A is a schematic circuit diagram illustrating an OTP non-volatile memory cell. As shown in FIG. 1A, the OTP non-volatile memory cell c1 comprises a floating gate transistor F and a switching transistor M. The first terminal of the OTP non-volatile memory cell c1 is connected with a source line SL. The second terminal of the OTP non-volatile memory cell c1 is connected with a bit line BL. The control terminal of the OTP non-volatile memory cell c1 is connected with a word line WL.

Please refer to FIG. 1A again. The first source/drain terminal of the switching transistor M is connected with the source line SL. The gate terminal of the switching transistor M is connected with the word line WL. The first source/drain terminal of the floating gate transistor F is connected with the second source/drain terminal of the switching transistor M. The second source/drain terminal of the floating gate transistor F is connected with the bit line BL.

For writing the OTP non-volatile memory cell c1, proper bias voltages are provided to the OTP non-volatile memory cell c1. Consequently, the OTP non-volatile memory cell c1 is programmed. During the program action of the OTP non-volatile memory cell c1, the amount of hot carriers to be injected into the floating gate of the floating gate transistor F is controlled. Consequently, the storage state of the OTP non-volatile memory cell c1 is adjusted. Moreover, the hot carriers are electrons.

For example, when the write action is performed on the OTP non-volatile memory cell c1, a program voltage is provided to the source line SL, an on voltage is provided to the word line WL, and a ground voltage is provided to the bit line BL. Consequently, the hot carriers are injected into the floating gate through a channel region of the floating gate transistor F. Moreover, when the write action is performed, the adjustment of the time period of providing the bias voltages can control the amount of hot carriers injected into the floating gate. Consequently, the OTP non-volatile memory cell c1 has various storage states. If the time period of providing the bias voltages to the OTP non-volatile memory cell c1 is increased, the amount of hot carriers injected into the floating gate is increased. Whereas, if the time period of providing the bias voltages to the OTP non-volatile memory cell c1 is decreased, the amount of hot carriers injected into the floating gate is decreased.

According to the amount of hot carriers injected into the floating gate from low to high, the memory cell c1 has the storage states from a first storage state to an X-th storage state, wherein X is larger than or equal to 4. For example, if the multi-level memory cell c1 is able to store the 2-bit data, X=4. That is, the memory cell c1 is in one of a first storage state, a second storage state, a third storage state and a fourth storage state. Whereas, if the multi-level memory cell c1 is able to store the 3-bit data, X=8. That is, the memory cell c1 is in one of the storage states from the first storage state to the eighth storage state. Whereas, if the multi-level memory cell c1 is able to store the 4-bit data, X=16. That is, the memory cell c1 is in one of the storage states from the first storage state to the sixteenth storage state.

In addition to the time period of providing the bias voltages to the OTP non-volatile memory cell c1, the adjustment of the program voltage can adjust the storage state of the OTP non-volatile memory cell c1. Generally, as the magnitude of the program voltage is increased, the amount of hot carriers injected into the floating gate is increased. Whereas, as the magnitude of the program voltage is decreased, the amount of hot carriers injected into the floating gate is decreased.

For performing a read action, proper bias voltages are provided to the OTP non-volatile memory cell c1. Consequently, the OTP non-volatile memory cell c1 generates a cell current. According to the magnitude of the cell current, the storage state of the OTP non-volatile memory cell c1 can be judged. When the read action is performed, a read voltage is provided to the source line SL, the on voltage is provided to the word line WL, and the ground voltage is provided to the bit line BL. Consequently, the magnitude of the cell current is determined according to the storage state of the OTP non-volatile memory cell c1.

For example, if the multi-level memory cell c1 is able to store the 2-bit data, the magnitudes of the generated cell currents corresponding to the four storage states are different during the read action. For example, the generated cell current corresponding to the first storage state is 0.1 μA, the generated cell current corresponding to the second storage state is 0.6 μA, the generated cell current corresponding to the third storage state is 1.1 μA, and the generated cell current corresponding to the fourth storage state is 1.6 μA. Similarly, in case that the multi-level memory cell is able to store the 3-bit data, the magnitudes of the generated cell currents corresponding to the eight storage states are different during the read action. Similarly, in case that the multi-level memory cell is able to store the 4-bit data, the magnitudes of the generated cell currents corresponding to the sixteen storage states are different during the read action.

Figure 1B:
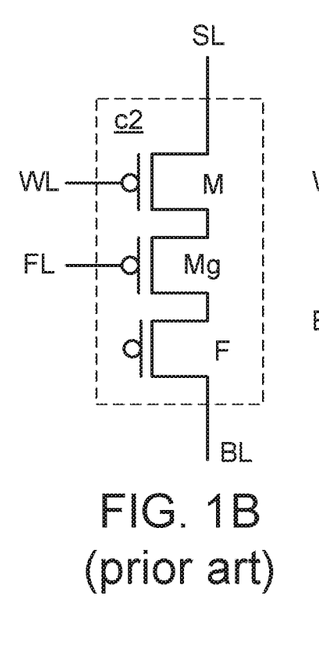

Generally, the magnitude of the program voltage is high. In order to prevent from damage of the switching transistor M during the write cycle, the OTP non-volatile memory cell may be further equipped with a following transistor. FIG. 1B is a schematic circuit diagram illustrating another OTP non-volatile memory cell. As shown in FIG. 1B, the OTP non-volatile memory cell c2 comprises a floating gate transistor F, a following transistor Mg and a switching transistor M. The first terminal of the OTP non-volatile memory cell c2 is connected with a source line SL. The second terminal of the OTP non-volatile memory cell c2 is connected with a bit line BL. The first control terminal of the OTP non-volatile memory cell c2 is connected with a word line WL. The second control terminal of the OTP non-volatile memory cell c2 is connected with a following line FL.

Please refer to FIG. 1B again. The first source/drain terminal of the switching transistor M is connected with the source line SL. The gate terminal of the switching transistor M is connected with the word line WL. The first source/drain terminal of the following transistor Mg is connected with the second source/drain terminal of the switching transistor M. The gate terminal of the following transistor Mg is connected with the following line FL. The first source/drain terminal of the floating gate transistor F is connected with the second source/drain terminal of the following line FL. The second source/drain terminal of the floating gate transistor F is connected with the bit line BL. Similarly, the OTP non-volatile memory cell c2 is also a multi-level memory cell. Generally, the operation of the switching transistor M and the operation of the following transistor Mg are similar. When the switching transistor M is turned on, the following transistor Mg is turned on. When the switching transistor M is turned off, the following transistor Mg is turned off. The bias voltages and the operating principles of the OTP non-volatile memory cell c2 for performing the write action and the read action are similar to those of the OTP non-volatile memory cell c1, and are not redundantly described herein.

Figure 1C:
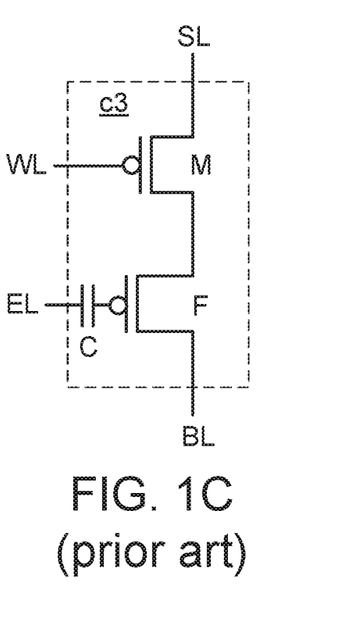

FIG. 1C is a schematic circuit diagram illustrating an MTP non-volatile memory cell. In comparison with the OTP non-volatile memory cell c1 of FIG. 1A, the MTP non-volatile memory cell c3 further comprises an erase capacitor C. The erase capacitor C is connected between the floating gate of the floating gate transistor F and an erase line EL. When the write action and the read action are performed, a ground voltage is provided to the erase line EL, and the other bias voltages provided to the MTP non-volatile memory cell c3 are similar to those of the OTP non-volatile memory cell c1. The detailed operations are redundantly described herein. For performing an erase action, an erase voltage is provided to the erase line EL. Consequently, the hot carriers are moved from the erase capacitor C to the erase line EL and ejected from the floating gate.

Figure 1D:
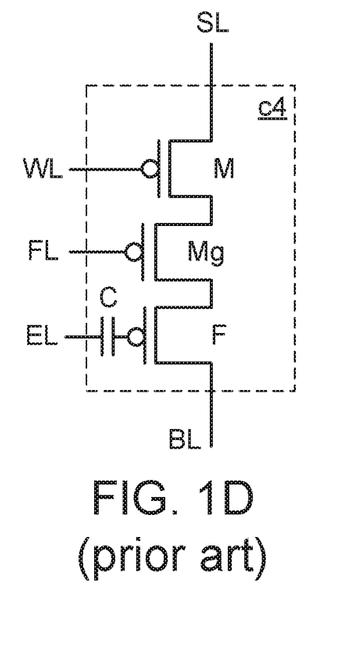

FIG. 1D is a schematic circuit diagram illustrating another MTP non-volatile memory cell. In comparison with the OTP non-volatile memory cell c2 of FIG. 1B, the MTP non-volatile memory cell c4 further comprises an erase capacitor C. The erase capacitor C is connected between the floating gate of the floating gate transistor F and an erase line EL. When the write action and the read action are performed, a ground voltage is provided to the erase line EL, and the other bias voltages provided to the MTP non-volatile memory cell c4 are similar to those of the OTP non-volatile memory cell c2. The detailed operations are not redundantly described herein. Similarly, for performing an erase action, an erase voltage is provided to the erase line EL. Consequently, the hot carriers are moved from the erase capacitor C to the erase line EL and ejected from the floating gate.

In the non-volatile memory cells as shown in FIGS. 1A to 1D, the transistors are P-type transistors. Alternatively, the transistors of the OTP non-volatile memory cells and the MTP non-volatile memory cells are N-type transistors.

Figure 1E:
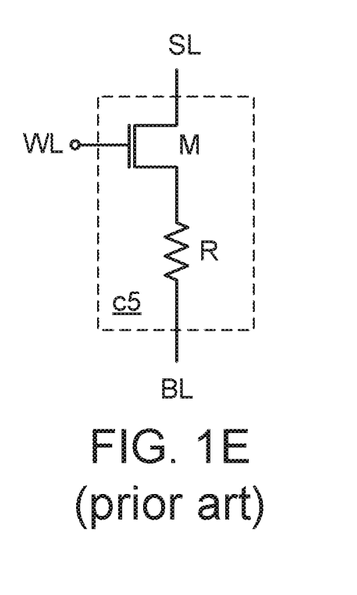

FIG. 1E is a schematic circuit diagram illustrating another MTP non-volatile memory cell. As shown in FIG. 1E, the MTP non-volatile memory cell c5 comprises a switching transistor M and a resistor R. The first terminal of the MTP non-volatile memory cell c5 is connected with a source line SL. The second terminal of the MTP non-volatile memory cell c5 is connected with a bit line BL. The control terminal of the MTP non-volatile memory cell c5 is connected with a word line WL.

The first source/drain terminal of the switching transistor M is connected with the source line SL. The gate terminal of the switching transistor M is connected with the word line WL. The second source/drain terminal of the switching transistor M is connected with the first terminal of the resistor R. The second terminal of the resistor R is connected with the bit line BL. The resistor R is made of transition metal oxide (TMO).

Generally, the resistance of the resistor R and the storage state of the resistor R can be determined according to the voltage difference between the first terminal and the second terminal of the resistor R. In other words, when the write action is performed, proper bias voltages are provided to the MTP non-volatile memory cell c5. Consequently, the storage state of the MTP non-volatile memory cell c5 is controllable.

Figure 2:
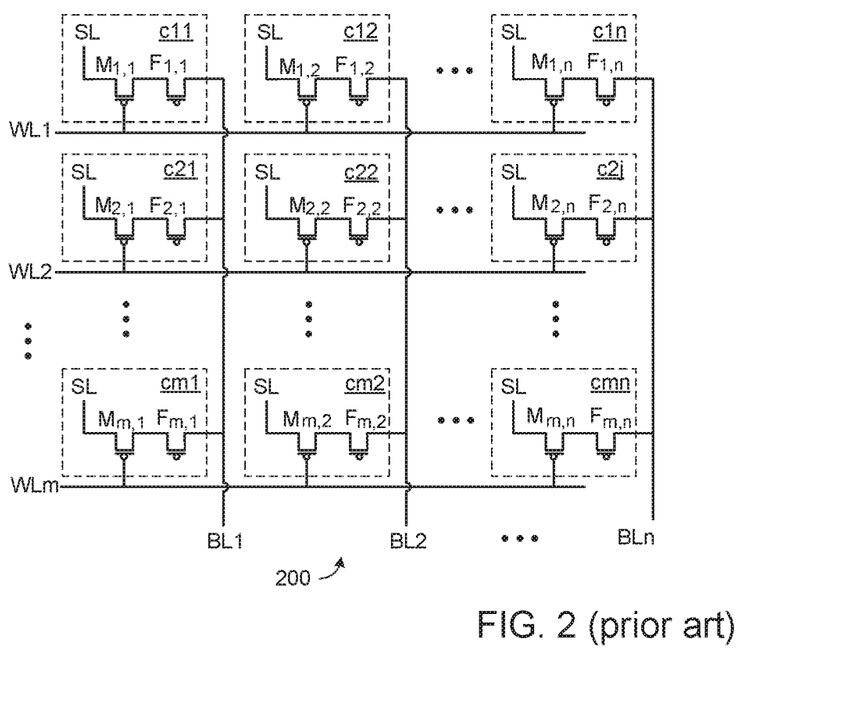
FIG. 2 (prior art) is a schematic circuit diagram illustrating a cell array of a non-volatile memory.

FIG. 2 is a schematic circuit diagram illustrating a cell array of a non-volatile memory. As shown in FIG. 2, the cell array 200 comprises a plural memory cells c11~cmn, which are arranged in an m×n array. Each of the memory cells c11~cmn has the structure of the OTP non-volatile memory cell c1. It is noted that the structure of the memory cell is not restricted. That is, the memory cells c2~c5 may be constituted as other cell arrays.

The memory cells c11~cmn comprise switching transistors $M_{1,1}$~$M_{m,n}$ and floating gate transistors $F_{1,1}$~$F_{m,n}$, respectively. Each of the memory cells c11~cmn has the structure of the OTP non-volatile memory cell c1. The detailed structure of the memory cell is not redundantly described herein. The first terminals of the memory cells c11~cmn are connected with a source line SL, wherein m and n are positive.

The control terminals of the n memory cells c11~c1n in the first row are connected with a word line WL1. The second terminals of the n memory cells c11~c1n in the first row are connected with the corresponding bit lines BL1~BLn, respectively. The control terminals of the n memory cells c21~c2n in the second row are connected with a word line WL2. The second terminals of the n memory cells c21~c2n in the second row are connected with the corresponding bit lines BL1~BLn, respectively. The rest may be deduced by analog.

Generally, during the write action or the read action of the non-volatile memory, only one of the m word lines WL1~WLm of the cell array 200 is activated and the other word lines are inactivated. For example, if the word line WL1 is activated during the write action, the first row is the selected row. By controlling the time period of providing the bias voltages to the memory cells c11~c1n of the selected row, the storage states of the memory cells c11~c1n are controllable.

SUMMARY OF THE INVENTION

The present invention provides a non-volatile memory with a multi-level cell array and an associated read control method. When a read action of the non-volatile memory is performed, a sensing circuit sequentially provides different reference currents to judge the storage states of the memory cells. After all of the reference currents are provided, the sensing circuit determines the storage states of all memory cells of the selected row.

An embodiment of the present invention provides a non-volatile memory. The non-volatile memory includes a cell array, a current supply circuit, a path selecting circuit and a judging circuit. The cell array includes plural multi-level memory cells in an m×n array. The cell array is connected with m word lines and n lines. Each of the plural multi-level memory cells is in one of X storage states. Moreover, X is larger than or equal to 4. The current supply circuit provides X reference currents according to a current control value Mc. The path selecting circuit is connected with the current supply circuit and the n bit lines. The path selecting circuit includes n path selectors. A first path selector of the n path selectors is connected with the current supply circuit and the first bit line. The judging circuit is connected with the path selecting circuit, and generates n output data. The judging circuit comprises n judging devices. A first judging device of the n judging devices is connected with the first path selector and generates a first output data. In an Mc-th storage state judging phase of a read action, an Mc-th reference current from the current supply circuit is transmitted to the first judging device through the first path selector and converted into a first reference voltage, and then a first cell current generated by the first multi-level memory cell of the plural multi-level memory cells is transmitted to the first judging device through the first bit line and the first path selector and converted into a first sensed voltage. According to a result of comparing the first reference voltage with the first sensed voltage, the first judging device selectively stores the current control value Mc as the first output data. Moreover, m, n, Mc and X are positive integers, Mc is larger than 1, and Mc is smaller than or equal to X.

Another embodiment of the present invention provides a read control method for the non-volatile memory. Firstly, a selected row of the cell array is determined. The selected row includes n memory cells. Then, Mc is set as X. In a step (a), the current supply circuit provides the Mc-th reference current. In a step (b), the n judging circuits sequentially receive the Mc-th reference current and generate the corresponding reference voltages. In a step (c), the n judging circuits receive the n cell currents from the n memory cells of the selected row and generate n sensed voltages. In a step (d), each of the n judging circuits selectively stores Mc according to a result of comparing the corresponding sensed voltage with the corresponding reference voltage. If Mc is not equal to 1, 1 is subtracted from M, and the step (a) is performed again. If Mc is equal to 1, the n current control values in the n judging circuits are stored as n output data, and the storage states of the n memory cells are determined according to the n output data.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention provides a non-volatile memory with a multi-level cell array and an associated read control method. When a read action of the non-volatile memory is performed, a sensing circuit sequentially provides different reference currents to judge the storage states of the memory cells. After all of the reference currents are provided, the sensing circuit determines the storage states of all memory cells of the selected row.

Take the memory cell c1 as shown in FIG. 1A for example. According to the amount of hot carriers injected into the floating gate from low to high, the memory cell c1 has the storage states from a first storage state to an X-th storage state, wherein X is larger than or equal to 4. For example, if the multi-level memory cell c1 is able to store the 2-bit data, X=4. That is, the memory cell c1 is in one of a first storage state, a second storage state, a third storage state and a fourth storage state. Whereas, if the multi-level memory cell c1 is able to store the 3-bit data, X=8. That is, the memory cell c1 is in one of the storage states from the first storage state to the eighth storage state. Whereas, if the multi-level memory cell c1 is able to store the 4-bit data, X=16. That is, the memory cell c1 is in one of the storage states from the first storage state to the sixteenth storage state.

For example, if the multi-level memory cell is able to store the 2-bit data, the magnitudes of the generated cell currents corresponding to the four storage states are different. For example, the generated cell current corresponding to the first storage state is 0.1 μA, the generated cell current corresponding to the second storage state is 0.6 μA, the generated cell current corresponding to the third storage state is 1.1 μA, and the generated cell current corresponding to the fourth storage state is 1.6 μA. For example, the multi-level memory cells of the cell array are able to store the 2-bit data. When the read action is performed, the sensing circuit sequentially provides the reference currents of 1.6 μA, 1.1 μA, 0.6 μA and 0.1 μA to judge the storage states of all memory cells of the selected row.

Hereinafter, the multi-level memory cell capable of storing 2-bit data will be taken as an example to describe the concepts of the present invention. It is noted that the technology of the present invention can be applied to the multi-level memory cell capable of storing the data with more than two bits.

Figure 3:
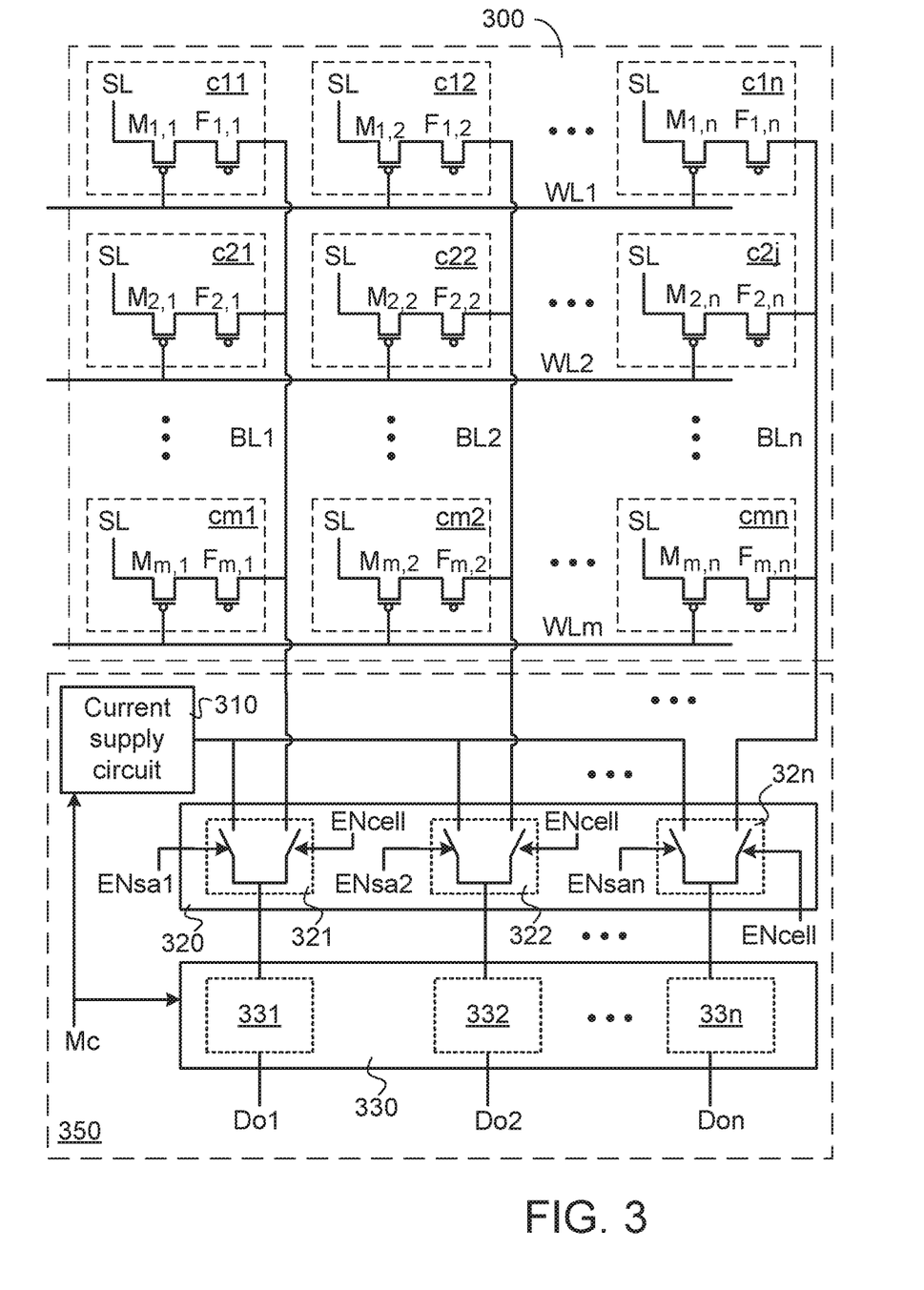
FIG. 3 is a schematic circuit diagram illustrating a non-volatile memory according to the embodiment of the present invention.

FIG. 3 is a schematic circuit diagram illustrating a non-volatile memory according to the embodiment of the present invention. As shown in FIG. 3, the non-volatile memory comprises a cell array 300 and a sensing circuit 350. The sensing circuit 350 comprises a current supply circuit 310, a path selecting circuit 320 and a judging circuit 330. The cell array 300 comprises plural memory cells in an m×n array. The circuitry structure of the cell array 300 is similar to the circuitry structure of the cell array as shown in FIG. 2, and not redundantly described herein. The memory cells of the cell array 300 are OTP memory cells or MTP memory cells.

The current supply circuit 310 of the sensing circuit 350 comprises plural current sources to provide plural reference currents. According to a current control value Mc, the current supply circuit 310 generates one of the plural reference currents. In case that the multi-level memory cell is able to store the 2-bit data, the current supply circuit 310 generates one of four reference currents according to the current control value Mc. In case that the multi-level memory cell is able to store the 3-bit data, the current supply circuit 310 provides one of eight reference currents according to the current control value Mc. In case that the multi-level memory cell is able to store the 4-bit data, the current supply circuit 310 provides one of sixteen reference currents according to the current control value Mc. The path selecting circuit 320 of the sensing circuit 350 comprises n path selectors 321~32n. The judging circuit 330 of the sensing circuit 350 comprises n judging devices 331~33n. The n judging devices 331~33n generates n output data Do1~Don, respectively. The structures of the path selectors 321~32n are identical. The structures of the judging devices 331~33n are identical.

The operations of the path selector 321 and the judging device 331 will be described as follows. The path selector 321 comprises a reference current path and a cell current path. The reference current path is connected with the current supply circuit 310. The cell current path is connected with the bit line BL1. The reference current path is controlled according to a reference current enable signal ENsa1. The cell current path is controlled according to a cell current enable signal ENcell. When the reference current enable signal ENsa1 is activated, the current supply circuit 310 is connected with the judging device 331 through the reference current path of the path selector 321. When the cell current enable signal ENcell is activated, the bit line BL1 is connected with the judging device 331 through the cell current path of the path selector 321.

When the read action is performed, the current supply circuit 310 generates the corresponding reference current according to the current control value Mc. The judging device 331 receives the reference current from the current supply circuit 310 and converts the reference current into a reference voltage. Then, the judging device 331 receives the cell current from the bit line BL1 and converts the cell current into a sensed voltage. Then, the judging device 331 generates a latching signal according to the reference voltage and the sensed voltage. When the latching signal is activated, a latching circuit of the judging device 331 is enabled and the current control value Mc is stored as the output data Do1. The output data Do1 indicates the storage state of the memory cell.

Figure 4A:
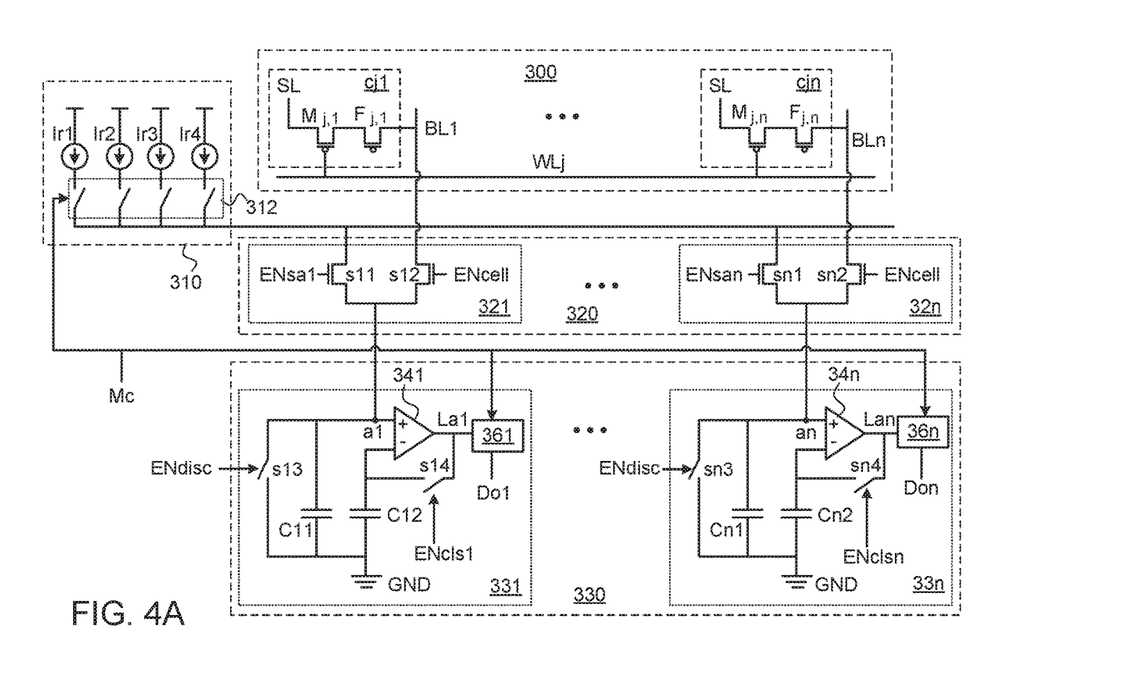
FIG. 4A is a schematic circuit diagram illustrating the detailed structures of the current supply circuit, the path selecting circuit and the judging circuit of the non-volatile memory as shown in FIG. 3.
Figure 4B:
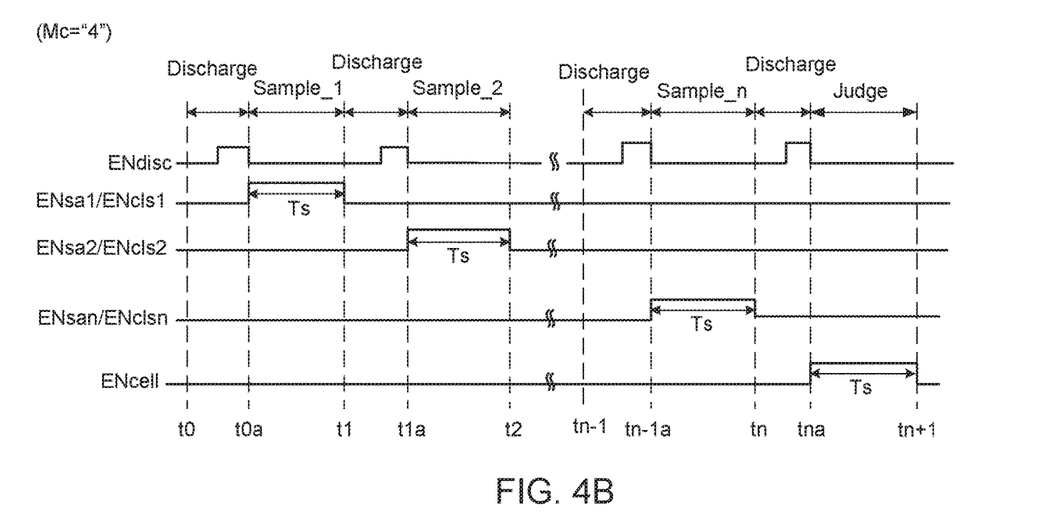
FIG. 4B is a schematic timing waveform diagram illustrating associated signals of the path selecting circuit and the judging circuit.

Please refer to FIGS. 4A and 4B. FIG. 4A is a schematic circuit diagram illustrating the detailed structures of the current supply circuit, the path selecting circuit and the judging circuit of the non-volatile memory as shown in FIG. 3. FIG. 4B is a schematic timing waveform diagram illustrating associated signals of the path selecting circuit and the judging circuit. For succinctness, only n memory cells cj1~cjn in the j-th row of the cell array 300 are shown in FIG. 4A. These memory cells are connected with the word line WLj.

The current supply circuit 310 comprises four current sources and a multiplexer 312. The first current source may generate a first reference current Ir1. The second current source may generate a second reference current Ir2. The third current source may generate a third reference current Ir3. The fourth current source may generate a fourth reference current Ir4. The four input terminals of the multiplexer 312 are connected with the four current sources, respectively. The control terminal of the multiplexer 312 receives the current control value Mc. Moreover, one of the four reference currents Ir1~Ir4 is outputted from the multiplexer 312.

For example, in case that the multi-level memory cell is able to store the 2-bit data, the current supply circuit 310 may generate four (X=4) reference currents corresponding to the different storage states. If the current control value Mc is "1", the current supply circuit 310 generates the first reference current (e.g., 0.1 μA). If the current control value Mc is "2", the current supply circuit 310 generates the second reference current (e.g., 0.6 μA). If the current control value Mc is "3", the current supply circuit 310 generates the third reference current (e.g., 1.1 μA). If the current control value Mc is "4", the current supply circuit 310 generates the fourth reference current (e.g., 1.6 μA).

The path selecting circuit 320 comprises n path selectors 321~32n. The judging circuit 330 comprises n judging devices 331~33n. The structures of the path selectors 321~32n are identical. The structures of the judging devices 331~33n are identical. The operations of the path selector 321 and the judging device 331 will be described as follows.

The reference current path of the path selector 321 comprises a switching transistor s11. The first source/drain terminal of the switching transistor s11 is connected with the current supply circuit 310. The second source/drain terminal of the switching transistor s11 is connected with the node a1. The gate terminal of the switching transistor s11 receives the reference current enable signal ENsa1. The cell current path of the path selector 321 comprises a switching transistor s12. The first source/drain terminal of the switching transistor s12 is connected with the bit line BL1. The second source/drain terminal of the switching transistor s12 is connected with the node a1. The gate terminal of the switching transistor s12 receives the current enable signal ENcell.

The judging device 331 comprises an operation amplifier 341, a switch s13, a switch s14, a capacitor C11, a capacitor C12 and a latching circuit 361. The first terminal of the switch s13 is connected with the node a1. The second terminal of the switch s13 is connected with a ground terminal GND. The control terminal of the switch s13 receives a discharge enable signal ENdisc. The first terminal of the capacitor C11 is connected with the node a1. The second terminal of the capacitor C11 is connected with the ground terminal GND. The first terminal of the capacitor C12 is connected with a negative input terminal of the operation amplifier 341. The second terminal of the capacitor C12 is connected with the ground terminal GND. A positive input terminal of the operation amplifier 341 is connected with the node a1. An output terminal of the operation amplifier 341 generates a latching signal La1. The first terminal of the switch s14 is connected with the output terminal of the operation amplifier 341. The second terminal of the switch s14 is connected with the negative input terminal of the operation amplifier 341. The control terminal of the switch s14 receives a close-loop enable signal ENcls1. The latching circuit 361 receives the current control value Mc and the latching signal La1. When the latching signal La1 is activated, the latching circuit 361 is enabled and the current control value Mc is stored as the output data Do1. The output data Do1 indicates the storage state of the memory cell. In an embodiment, the switches s13 and s14 are transistors.

When the word line WLj is activated, the write action is performed on the memory cells cj1~cjn of the selected row. During the read action, the current supply circuit 310, the path selecting circuit 320 and the judging circuit 330 are enabled to judge the storage states of the memory cells cj1~cjn of the selected memory row.

The read action contains a first storage state judging phase, a second storage state judging phase, a third storage state judging phase and a fourth storage state judging phase. The operations of the current supply circuit 310, the path selecting circuit 320 and the judging circuit 330 in the fourth storage state judging phase will be described as follows.

As shown in FIG. 4B, the current control value Mc is "4" in the fourth storage state judging phase. Meanwhile, the current supply circuit 310 generates the fourth reference current Ir4. Moreover, the fourth storage state judging phase contains n reference current sampling phases and a cell current sampling phase. In the n reference current sampling phases, the reference current enable signals ENsa1~ENsan and the close-loop enable signal ENcls1~ENclsn are activated.

Please refer to FIG. 4B. In the first reference current sampling phase between the time point t0 and the time point t1, the path selector 321 and the judging device 331 are enabled. In the second reference current sampling phase between the time point t1 and the time point t2, the path selector 322 and the judging device 332 are enabled. The rest may be deduced by analog. In the n-th reference current sampling phase between the time point tn−1 and the time point tn, the path selector 32n and the judging device 33n are enabled. In the cell current sampling phase between the time point tn and the time point tn+1, the n path selectors 321~32n and the n judging devices 331~33n are enabled.

Each reference current sampling phase contains a discharge period and a sample period. For example, in the first reference current sampling phase, the time period between the time point t0 and the time point t0a is the discharge period and the time period between the time point t0a and the time point t1 is the sample period Sample_1.

In an embodiment, the time durations of the sample periods Samle_1~Sample_n in the reference current sampling phases and the time duration of the judging period Judge in the cell current sampling phase are equal to Ts. It is noted that the time durations of the sample periods and the time duration of the judging period may be varied according to the practical requirements.

FIGS. 5A~5D are schematic circuit diagrams illustrating the operations of the path selector 321 and the judging device 331 during the fourth storage state judging phase.

Figure 5A:
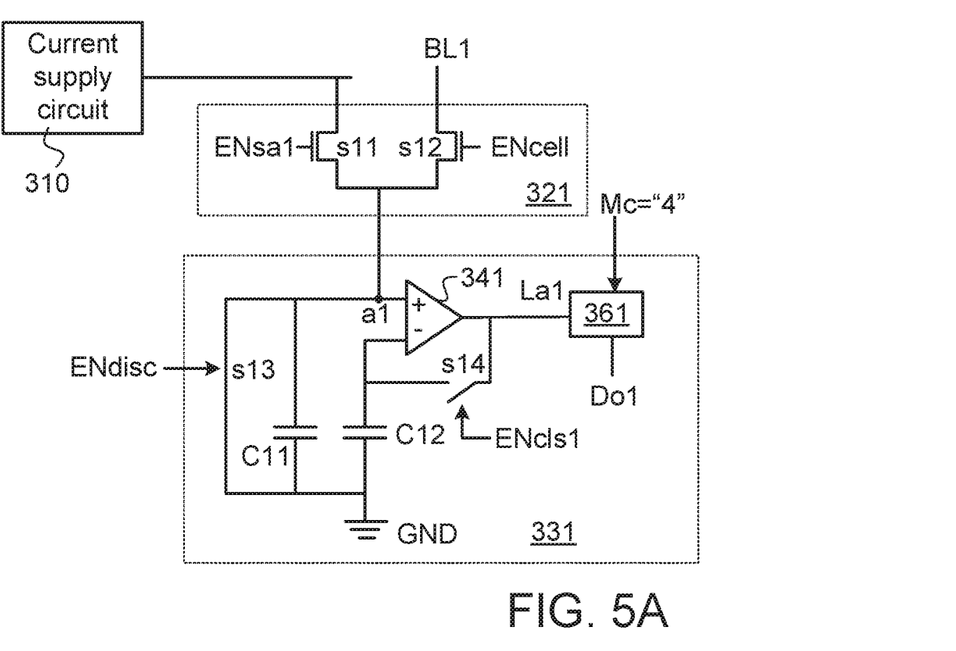
FIGS. 5A~5D are schematic circuit diagrams illustrating the operations of a path selector of the path selecting circuit and a judging device of the judging circuit as shown in FIG. 4A during the fourth storage state judging phase.

Please refer to FIGS. 4B and 5A. In the discharge period between the time point t0 and the time point t0a, only the discharge enable signal ENdisc is enabled. Consequently, the switch s13 of the judging device 331 is in a close state, and the voltage of the capacitor C11 is discharged to the ground voltage (0V).

Figure 5B:
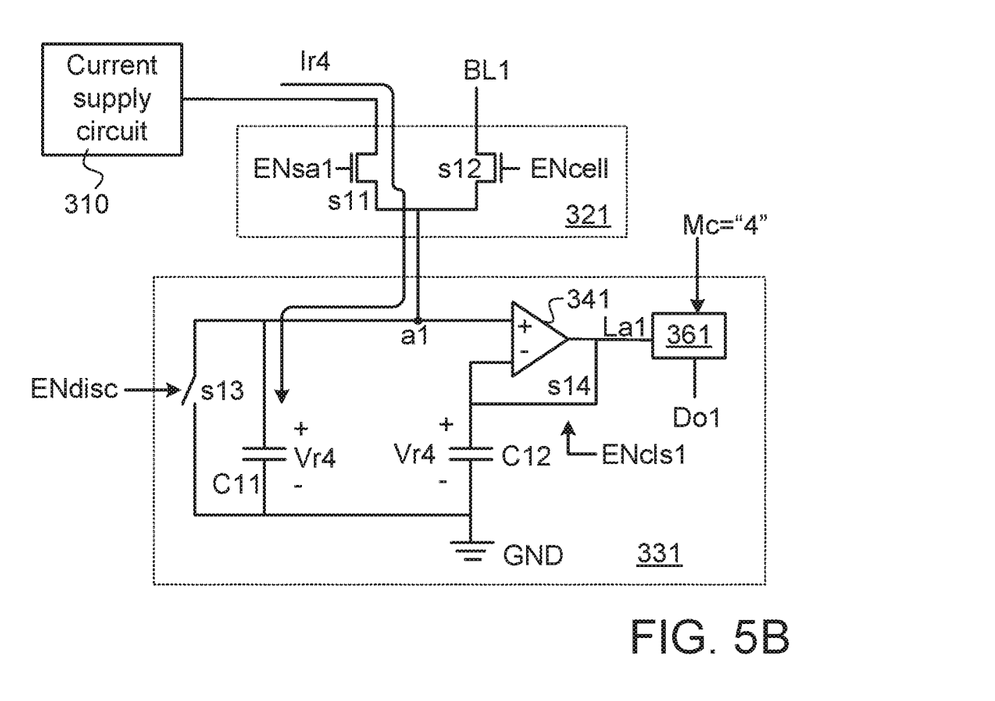

Please refer to FIGS. 4B and 5B. In the sample period Sample_1 between the time point t0a and the time point t1, the reference current enable signal ENsa1 and the close-loop enable signal ENcls1 are activated. Consequently, the reference current path of the path selector 321 is connected between the current supply circuit 310 and the judging device 331, and the switch s14 of the judging device 331 is in the close state. Under this circumstance, the operation amplifier 341 becomes a unit gain buffer. The current supply circuit 310 provides the fourth reference current Iref4 to charge the capacitor C11. In addition, the unit gain buffer duplicates the voltage of the capacitor C11 to the capacitor C12. In other words, at the time point t1, the voltage of the capacitor C11 is charged to a reference voltage Vr4 and the voltage of the capacitor C12 is charged to the reference voltage Vr4.

In the second reference current sampling phase between the time point t1 and the time point t2, the path selector 322 and the judging device 332 are enabled. The operations are similar to those of FIGS. 5A and 5B, and not redundantly described herein.

Figure 5C:
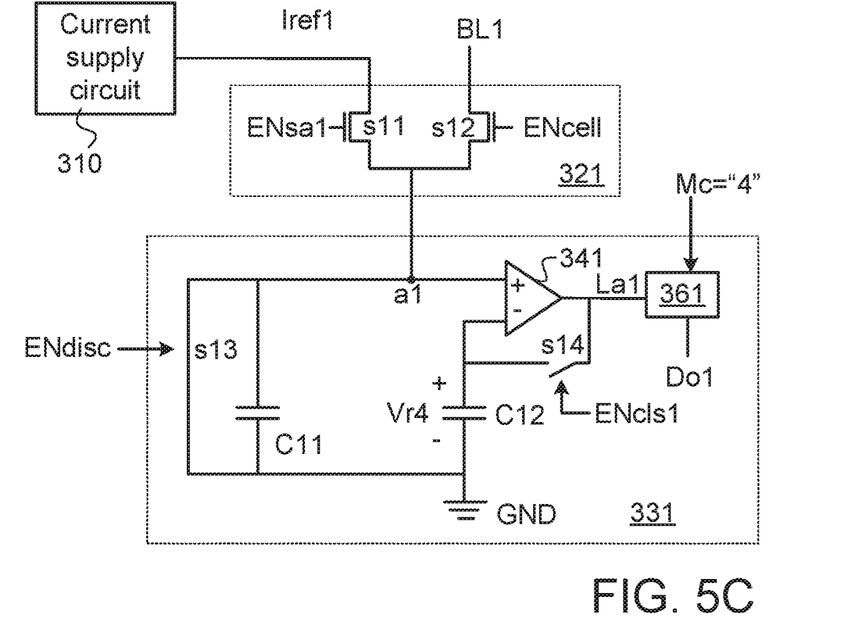

Please refer to FIGS. 4B and 5C. After the time point t1, the switch s13 of the judging device 331 is in the close state according to the discharge enable signal ENdisc. Consequently, the voltage of the capacitor C11 is discharged to the ground voltage (0V). Meanwhile, the reference voltage Vr4 is stored in the capacitor C12 only.

In other words, after the n reference current sampling phases, the reference voltage Vr4 is stored in the capacitors C12~Cn2 of the judging devices 331~33n at the time point tn.

As shown in FIG. 4B, the time period between the time point tn and the time point tn+1 is the cell current sampling phase of the fourth storage state phase. In the discharge period of the cell current sampling phase, the discharge enable signal ENdisc is activated to assure that the voltages of the C11~Cn1 of the judging devices 331~33n are discharged to the ground voltage (0V). Then, in the judging period Judge of the cell current sampling phase, the cell current enable signal ENcell is activated. Consequently, the bit lines BL1~BLn are connected with the corresponding judging devices 331~33n through the corresponding cell current paths of the path selectors 321~32n. Meanwhile, the memory cells cj1~cjn of the selected memory row generate cell currents to the judging devices 331~33n.

Figure 5D:
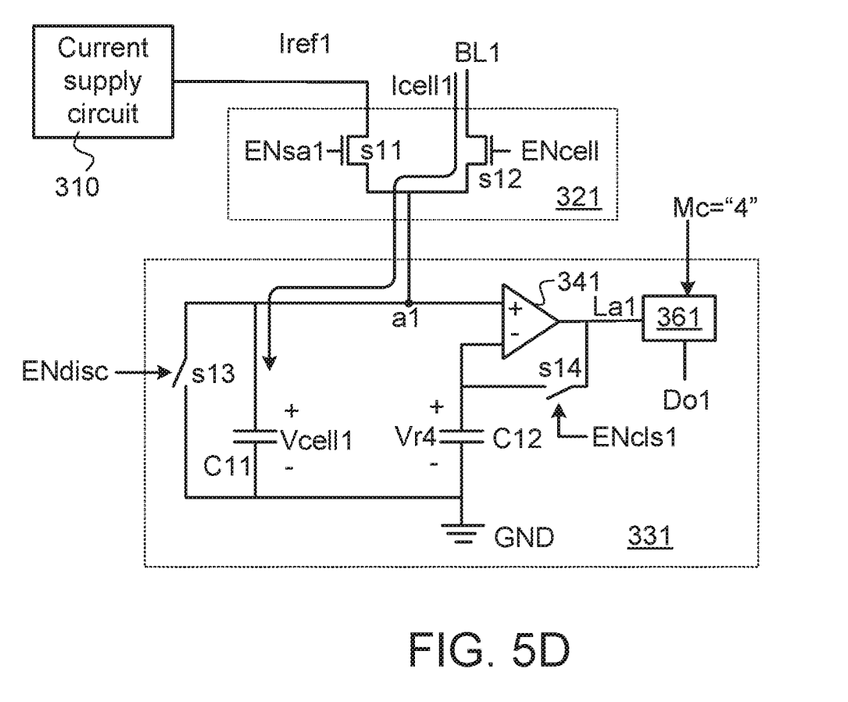

For example, as shown in FIG. 5D, the cell current path of the path selector 321 is connected between the bit line BL1 and the judging device 331. Consequently, the memory cell cj1 of the selected row generates a cell current Icell1 to the judging device 331 to charge the capacitor C11.

At the end of the cell current sampling phase (i.e., the time point tn+1), the operation amplifier 341 may be considered as a comparator for comparing the sensed voltage Vcell1 of the capacitor C11 and the reference voltage Vr4 of the capacitor C12. If the sensed voltage Vcell1 is lower than the reference voltage Vr4, it means that the cell current Icell1 is lower than the reference current Iref4. Since the latching signal La1 is in the low level state and the latching circuit 361 is disabled, the memory cell cj1 is not in the fourth storage state. Whereas, if the sensed voltage Vcell1 is higher than the reference voltage Vr4, it means that the cell current Icell1 is higher than the reference current Iref4. Meanwhile, the latching signal La1 is in the high level state. Consequently, the latching circuit 361 is enabled to latch the current control value Mc at "4" and generate the output data Do1. The output data Do1 indicates that the memory cell cj1 is in the fourth storage state.

Similarly, the corresponding latching circuits of the judging devices 332~33n are enabled or disabled according to the latching signals La2~Lan. The output data Do2~Don from the judging devices 332~33n can be used to judge whether the memory cells cj2~cjn are in the fourth storage state. After the latching circuit is enabled to generate the corresponding output data, the output data will not be changed in the subsequent storage state judging phases.

In the third storage state judging phase after the fourth storage state judging phase, the current control value Mc is "3". Meanwhile, the current supply circuit 310 generates the third reference current Ir3. Consequently, the judging devices 331~33n judge the memory cells of the selected row in the third storage state. In the second storage state judging phase after the third storage state judging phase, the current control value Mc is "2". Meanwhile, the current supply circuit 310 generates the second reference current Ir2. Consequently, the judging devices 331~33n judge the memory cells of the selected row in the second storage state. In the first storage state judging phase after the second storage state judging phase, the current control value Mc is "1". Meanwhile, the current supply circuit 310 generates the first reference current Ir1. Consequently, the judging devices 331~33n judge the memory cells of the selected row in the first storage state.

According to the embodiment of the present invention, for keeping reference voltage Vr4 stable, the value of sample period (Ts) divided by the capacitance of C11 is inversely proportional to the fourth reference current Ir4 when the current control value Mc is "4". That is to say, the value of sample period (Ts) divided by the capacitance of C11 is inversely proportional to the corresponding reference current.

From the above descriptions, the storage state of the multi-level memory cell cj1~cjn of the selected row can be judged according to the output data Do1~Don from the n latching circuits 361~36n after the plural storage state judging phases of the read action.

Figure 6A:
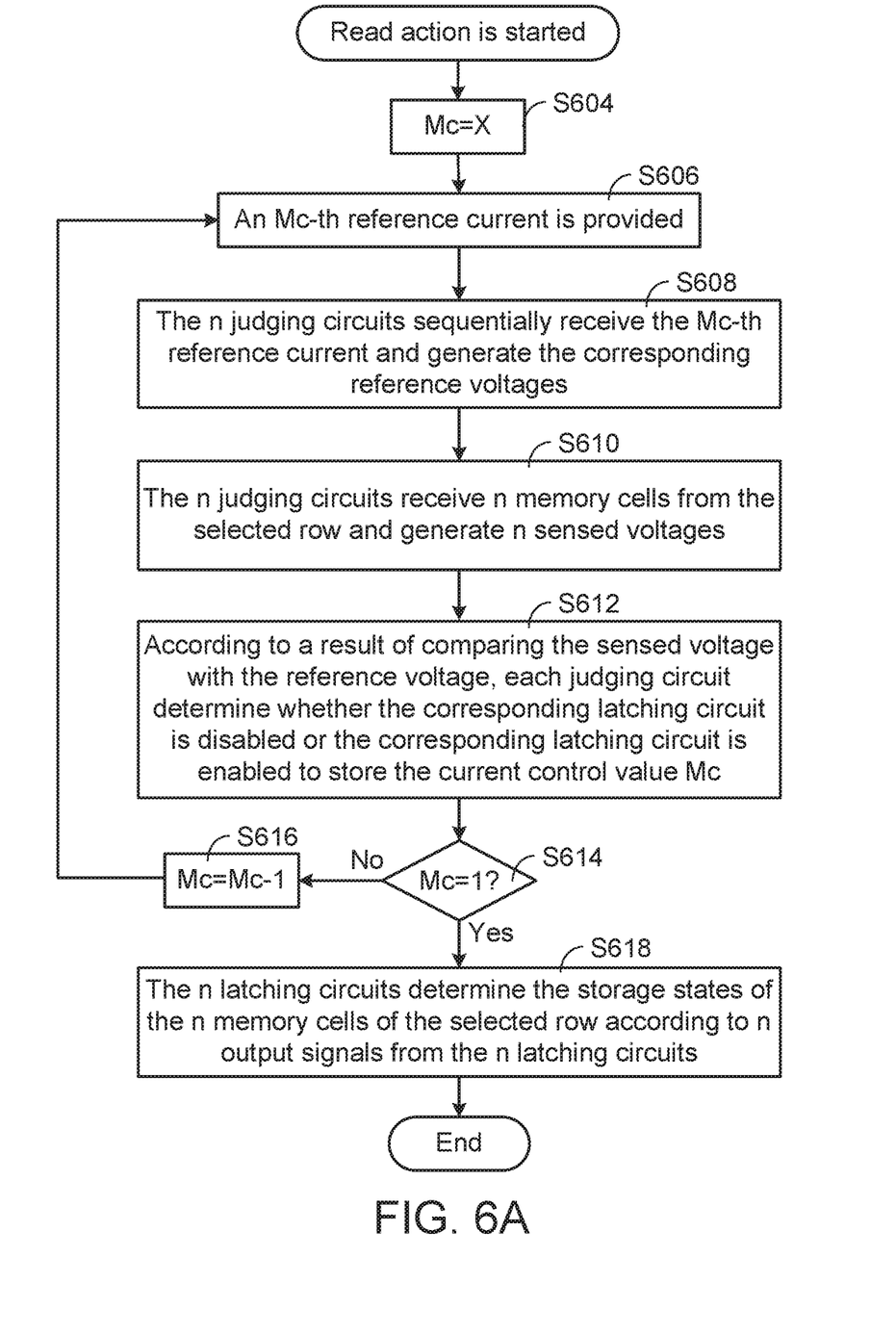
FIG. 6A is a flowchart illustrating a read control method for a multi-level memory cell according to an embodiment of the present invention.
Figure 6B:
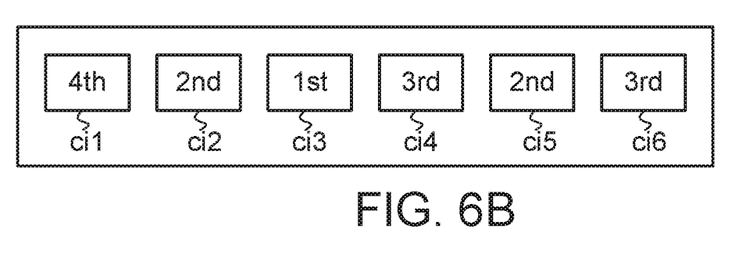
FIG. 6B schematically illustrates the target storage states of the memory cells in the selected row.
Figure 6C:
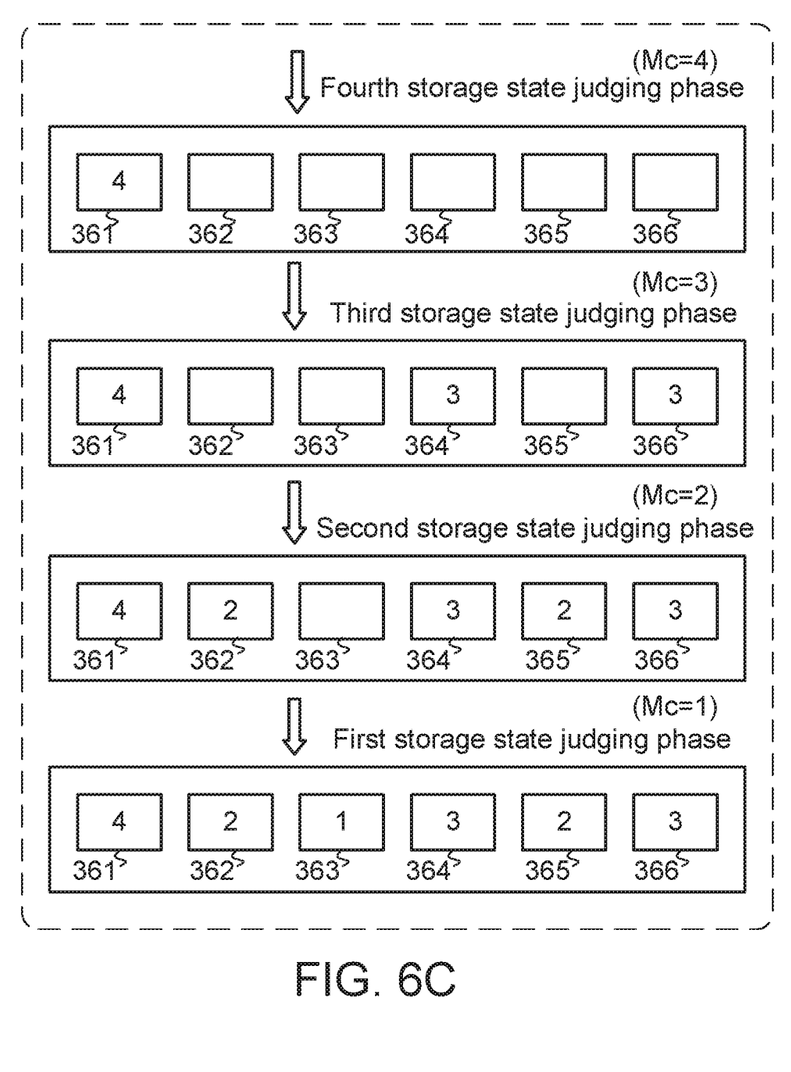
FIG. 6C schematically illustrates the operation of the read control method.

Please refer to FIGS. 6A, 6B and 6C. FIG. 6A is a flowchart illustrating a read control method for a multi-level memory cell according to an embodiment of the present invention. FIG. 6B schematically illustrates the target storage states of the memory cells in the selected row. FIG. 6C schematically illustrates the operation of the read control method. During the read action, the storage states of the n memory cells in a selected row of the cell array 300 are judged.

Please refer to FIG. 6A. After the read action is started, a current control value Mc is set as X (Step S604) and the current supply circuit 310 provides an Mc-th reference current (Step S606). That is, the current control value Mc set as "X" correspond to an X-th storage state judging phase.

Then, the n judging circuits sequentially receive the Mc-th reference current and generate the corresponding reference voltages (Step S608). That is, after the n reference current sampling phases, the corresponding reference voltages have been stored in the judging devices 331~33n.

Then, the n judging circuits receive n memory cells from the selected row and generate n sensed voltages (Step S610). That is, in the cell current sampling phase, all of the judging devices 331~33n generate the corresponding sensed voltages according to the received cell currents.

Then, according to a result of comparing the sensed voltage with the reference voltage, each judging circuit determines whether the corresponding latching circuit is disabled or the corresponding latching circuit is enabled to store the current control value Mc (Step S612). In other words, after the step S612 is completed, the memory cells of the selected row in the Mc-th storage state are determined.

Then, a step S614 is performed to judge whether Mc is equal to 1. If Mc is not equal to 1, 1 is subtracted from Mc (Step S616) and the step S606 is performed again. Then, the read action is in the next storage state judging phase. Whereas, if M is equal to 1, it means that the X storage state judging phases of the read action have been completed. That is, the n memory cells of the selected row have been judged. Then, the n latching circuits determine the storage states of the n memory cells of the selected row according to n output signals from the n latching circuits (Step S618). In this embodiment, X and Mc are positive integers.

The operations of the read control method will be illustrated with reference to FIGS. 6B and 6C. For example, each of the multi-level memory cells is able to store the 2-bit data. That is, X=4.

As shown in FIG. 6B, the selected row of the cell array comprises six memory cells ci1~ci6. The target storage states of the six memory cells ci1~ci6 are the fourth storage state (4th), the second storage state (2nd), the first storage state (1st), the third storage state (3rd), the second storage state (2nd) and the third storage state (3rd), respectively.

Please refer to FIG. 6C. After the read action is started, the current control value Mc is "4". Meanwhile, the current supply circuit 310 generates the fourth reference current corresponding to the fourth storage state judging phase. In the fourth storage state judging phase, the latching circuit 361 is enabled to store the current control value Mc. Consequently, the memory cell ci1 is judged to be in the fourth storage state. Since the latching circuits corresponding to the memory cells ci2~ci6 are disabled, the storage states of the memory cells ci2~ci6 cannot be judged.

Then, the current control value Mc is "3", and the current supply circuit 310 generates the third reference current corresponding to the third storage state judging phase. In the third storage state judging phase, the latching circuits 364 and 366 are enabled to store the current control value Mc. Consequently, the memory cells ci4 and ci6 are judged to be in the third storage state.

Then, the current control value Mc is "2", and the current supply circuit 310 generates the second reference current corresponding to the second storage state judging phase. In the second storage state judging phase, the latching circuits 362 and 365 are enabled to store the current control value Mc. Consequently, the memory cells ci2 and ci5 are judged to be in the second storage state.

Then, the current control value Mc is "1", and the current supply circuit 310 generates the first reference current corresponding to the second storage state judging phase. In the first storage state judging phase, the latching circuit 363 is enabled to store the current control value Mc. Consequently, the memory cell ci3 is judged to be in the first storage state.

After the four storage state judging phases are completed, the read action is ended. The values stored in all of the latching circuits 361~366 are the output data to indicate the storage states of the memory cells ci1~ci6 of the selected row.

As mentioned above, during the read action of the multi-level memory cell for storing the 2-bit data, four (i.e., X=4) storage state judging phases are required to confirm the storage states of all memory cells of the selected row. Similarly, during the read action of the multi-level memory cell for storing the 3-bit data, eight (i.e., X=8) storage state judging phases are required to confirm the storage states of all memory cells of the selected row. Similarly, during the read action of the multi-level memory cell for storing the 4-bit data, eight (i.e., X=16) storage state judging phases are required to confirm the storage states of all memory cells of the selected row.

In some embodiments, the non-volatile memory further comprises a voltage clamping circuit for fixing the reference current path and the cell current path at a specified bias voltage. Consequently, the cell current generated by the memory cell is more accurate.

Figure 7A:
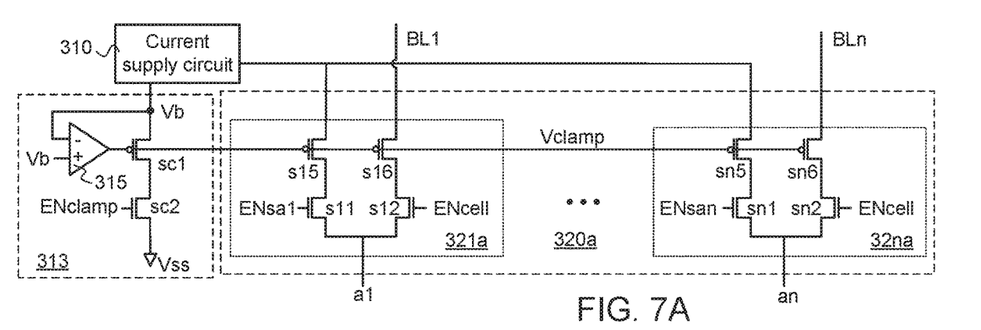
FIGS. 7A and 7B are schematic circuit diagrams illustrating two examples of a path selecting circuit with a voltage clamping circuit.
Figure 7B:
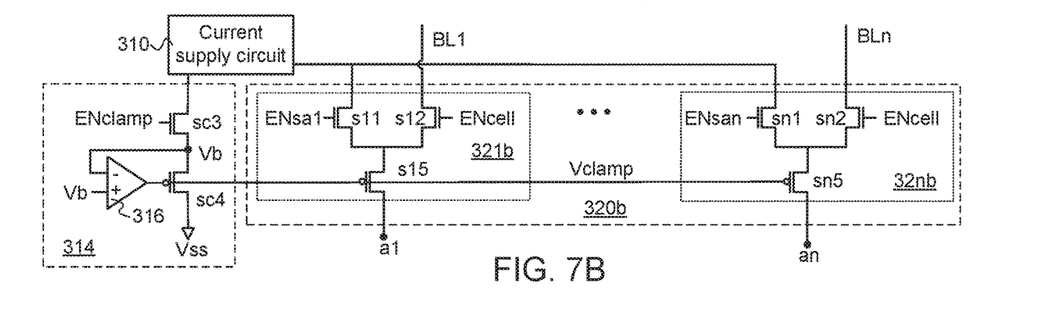

FIGS. 7A and 7B are schematic circuit diagrams illustrating two examples of a path selecting circuit with a voltage clamping circuit.

As shown in FIG. 7A, the path selecting circuit 320a comprises n path selectors 321a~32na and a voltage clamping circuit 313. The structures of the path selectors 321a~32na are identical. Consequently, only the path selector 321a will be described as follows.

The reference current path of the path selector 321a comprises a switching transistor s11 and a control transistor s15. The first source/drain terminal of the control transistor s15 is connected with the current supply circuit 310. The gate terminal of the control transistor s15 receives a clamp voltage Vclamp. The first source/drain terminal of the switching transistor s11 is connected with a second source/drain terminal of the control transistor s15. The second source/drain terminal of the switching transistor s11 is connected with the node a1. The gate terminal of the switching transistor s11 receives the reference current enable signal ENsa1.

The cell current path of the path selector 321a comprises a switching transistor s12 and a control transistor s16. The first source/drain terminal of the control transistor s16 is connected with the bit line BL1. The gate terminal of the control transistor s16 receives the clamp voltage Vclamp. The first source/drain terminal of the switching transistor s12 is connected with the second source/drain terminal of the control transistor s16. The second source/drain terminal of the switching transistor s12 is connected with the node a1. The gate terminal of the switching transistor s12 receives the cell current enable signal ENcell.

The voltage clamping circuit 313 comprises an operation amplifier 315, a switching transistor sc2 and a control transistor sc1. The positive input terminal of the operation amplifier 315 receives a bias voltage Vb. The negative input terminal of the operation amplifier 315 is connected with the first source/drain terminal of the control transistor sc1. The output terminal of the operation amplifier 315 generates the clamp voltage Vclamp. The first source/drain terminal of the control transistor sc1 is also connected with the current supply circuit 310. The gate terminal of the control transistor sc1 is connected with the output terminal of the operation amplifier 315. The first source/drain terminal of the switching transistor sc2 is connected with the second source/drain terminal of the control transistor sc1. The second source/drain terminal of the switching transistor sc2 receives a supply voltage Vss. The gate terminal of the switching transistor sc2 receives a clamp enable signal ENclamp.

When the path selecting circuit 320a is enabled, the clamp enable signal ENclamp is activated. Consequently, the negative input terminal of the operation amplifier 315 of the voltage clamping circuit 313 is fixed at the bias voltage Vb. The difference between the bias voltage Vb and the clamp voltage Vclamp is equal to the magnitude of a threshold voltage Vt of the control transistor sc1. That is, Vb=Vclamp+Vt. Similarly, the gate terminals of the other control transistors s15~sn5 and s16~sn6 of the path selecting circuit 320a receive the clamp voltage Vclamp. Consequently, the first source/drain terminals of the control transistors s15~sn5 and s16~sn6 are fixed at the bias voltage Vb.

As shown in FIG. 7B, the path selecting circuit 320b comprises n path selectors 321b~32nb and a voltage clamping circuit 314. The structures of the path selectors 321b~32nb are identical. Consequently, only the path selector 321b will be described as follows.

The reference current path of the path selector 321b comprises a switching transistor s11 and a control transistor s15. The first source/drain terminal of the switching transistor s11 is connected with the current supply circuit 310. The gate terminal of the switching transistor s11 receives the reference current enable signal ENsa1. The first source/drain terminal of the control transistor s15 is connected with the second source/drain terminal of the switching transistor s11. The second source/drain terminal of the control transistor s15 is connected with the node a1. The gate terminal of the control transistor s15 receives a clamp voltage Vclamp.

The cell current path of the path selector 321b comprises a switching transistor s12 and the control transistor s15. The first source/drain terminal of the switching transistor s12 is connected with the bit line BL1. The second source/drain terminal of the switching transistor s12 is connected with the first source/drain terminal of the control transistor s15. The gate terminal of the switching transistor s12 receives the cell current enable signal ENcell.

The voltage clamping circuit 314 comprises an operation amplifier 316, a switching transistor sc3 and a control transistor sc4. The positive input terminal of the operation amplifier 316 receives a bias voltage Vb. the negative input terminal of the operation amplifier 316 is connected with the first source/drain terminal of the control transistor sc4. The output terminal of the operation amplifier 316 generates the clamp voltage Vclamp. The first source/drain terminal of the switching transistor sc3 is connected with the current supply circuit 310. The gate terminal of the switching transistor sc3 receives a clamp enable signal ENclamp. The first source/drain terminal of the control transistor sc4 is connected with the second source/drain terminal of the switching transistor sc3. The second source/drain terminal of the control transistor sc4 is connected with a supply voltage Vss. The gate terminal of the control transistor sc4 is connected with the output terminal of the operation amplifier 316.

When the path selecting circuit 320b is enabled, the clamp enable signal ENclamp is activated. Consequently, the negative input terminal of the operation amplifier 316 of the voltage clamping circuit 313 is fixed at the bias voltage Vb.

The difference between the bias voltage Vb and the clamp voltage Vclamp is equal to the magnitude of a threshold voltage Vt of the control transistor sc4. That is, Vb=Vclamp+Vt. Similarly, the gate terminals of the other control transistors s15~sn5 of the path selecting circuit 320b receive the clamp voltage Vclamp. Consequently, the first source/drain terminals of the control transistors s15~sn5 are fixed at the bias voltage Vb.

From the above descriptions, the present invention provides a non-volatile memory with a multi-level cell array and an associated read control method. When the read action of the non-volatile memory is performed, a sensing circuit sequentially provides different reference currents to judge the storage states of the memory cells. After all of the reference currents are provided, the sensing circuit determines the storage states of all memory cells of the selected row.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A non-volatile memory, comprising:
   a cell array comprising plural multi-level memory cells in an m×n array, wherein the cell array is connected with m word lines and n bit lines, and each of the plural multi-level memory cells is in one of X storage states, wherein X is larger than or equal to 4;
   a current supply circuit providing X reference currents according to a current control value Mc;
   a path selecting circuit connected with the current supply circuit and the n bit lines, wherein the path selecting circuit comprises n path selectors, and a first path selector of the n path selectors is connected with the current supply circuit and a first bit line; and
   a judging circuit connected with the path selecting circuit, and generating n output data, wherein the judging circuit comprises n judging devices, and a first judging device of the n judging devices is connected with the first path selector and generates a first output data,
   wherein in an Mc-th storage state judging phase of a read action, an Mc-th reference current from the current supply circuit is transmitted to the first judging device through the first path selector and converted into a first reference voltage, and then a first cell current generated by a first multi-level memory cell of the plural multi-level memory cells is transmitted to the first judging device through the first bit line and the first path selector and converted into a first sensed voltage, wherein according to a result of comparing the first reference voltage with the first sensed voltage, the first judging device selectively stores the current control value Mc as the first output data, wherein m, n, Mc and X are positive integers, Mc is larger than 1, and Mc is smaller than or equal to X;
   wherein the first path selector comprises a reference current path and a cell current path, wherein the reference current path is controlled according to a reference current enable signal, and the cell current path is controlled according to a cell current enable signal, wherein when the reference current enable signal is activated, the current supply circuit is connected with the first judging device through the reference current path, wherein when the cell current enable signal is activated, the first bit line is connected with the first judging device through the cell current path;
   wherein the first judging device comprises: an operation amplifier, a first switch, a second switch, a first capacitor, a second capacitor, a first latching circuit; a first input terminal of the operation amplifier is connected with the first path selector, and an output terminal of the operation amplifier generates a first latching signal; a first terminal of the first switch is connected with the first input terminal of the operation amplifier, a second terminal of the first switch is connected with a ground terminal, and a control terminal of the first switch receives a discharge enable signal; a first terminal of the second switch is connected with the output terminal of the operation amplifier, a second terminal of the second switch is connected with a second input terminal of the operation amplifier, and a control terminal of the second switch receives a close-loop enable signal; a first terminal of the first capacitor is connected with the first input terminal of the operation amplifier, and a second terminal of the first capacitor is connected with the ground terminal; a first terminal of the second capacitor is connected with the second input terminal of the operation amplifier, and a second terminal of the second capacitor is connected with the ground terminal; and a first latching circuit receiving the first latching signal and the current control value Mc; and when the first latching signal is activated, the first latching circuit is enabled to store the current control value Mc as the first output data.

2. The non-volatile memory as claimed in claim 1, wherein the reference current path comprises a first switching transistor, and the cell current path comprises a second switching transistor, wherein a first source/drain terminal of the first switching transistor is connected with the current supply circuit, a second source/drain terminal of the first switching transistor is connected with the first judging device, a gate terminal of the first switching transistor receives the reference current enable signal, a first source/drain terminal of the second switching transistor is connected with the first bit line, a second source/drain terminal of the second switching transistor is connected with the first judging device, and a gate terminal of the second switching transistor receives the current enable signal.

3. The non-volatile memory as claimed in claim 1, wherein the non-volatile memory further comprises a voltage clamping circuit, and the voltage clamping circuit is connected with the current supply circuit and the path selecting circuit, wherein the voltage clamping circuit provides a clamp voltage to the path selecting circuit, so that the reference current path and the cell current path of the first path selector are fixed at a bias voltage.

4. The non-volatile memory as claimed in claim 3, wherein the reference current path comprises a first switching transistor and a first control transistor, the cell current path comprises a second switching transistor and a second control transistor, and the voltage clamping circuit comprises an operation amplifier, a third switching transistor and a third control transistor, wherein a first input terminal of the operation amplifier receives the bias voltage, a second input terminal of the operation amplifier is connected with a first source/drain terminal of the third control transistor, an output terminal of the operation amplifier generates the clamp voltage, a first source/drain terminal of the third control transistor is connected with the current supply circuit, a gate terminal of the third control transistor is connected with the output terminal of the operation amplifier, a first source/drain terminal of the third switching transistor is connected with a second source/drain terminal of the third control transistor, a second source/drain terminal of the third switching transistor receives a supply voltage, and a gate terminal of the third switching transistor receives a clamp enable signal, wherein a first source/drain terminal of the first control transistor is connected with the current supply circuit, a gate terminal of the first control transistor is connected with the output terminal of the operation amplifier, a first source/drain terminal of the first switching transistor is connected with a second source/drain terminal of the first control transistor, a second source/drain terminal of the first switching transistor is connected with the first judging device, and a gate terminal of the first switching transistor receives the reference current enable signal, wherein a first source/drain terminal of the second control transistor is connected with the first bit line, a gate terminal of the second control transistor is connected with the output terminal of the operation amplifier, a first source/drain terminal of the second switching transistor is connected with a second source/drain terminal of the second control transistor, a second source/drain terminal of the second switching transistor is connected with the first judging device, and a gate terminal of the second switching transistor receives the cell current enable signal.

5. The non-volatile memory as claimed in claim 3, wherein the reference current path comprises a first switching transistor and a first control transistor, the cell current path of the path selector comprises a second switching transistor and the first control transistor, and the voltage clamping circuit comprises an operation amplifier, a third switching transistor and a second control transistor, wherein a first input terminal of the operation amplifier receives the bias voltage, a second input terminal of the operation amplifier is connected with a first source/drain terminal of the second control transistor, an output terminal of the operation amplifier generates the clamp voltage, a first source/drain terminal of the third switching transistor is connected with the current supply circuit, a gate terminal of the third switching transistor receives a clamp enable signal, a first source/drain terminal of the second control transistor is connected with a second source/drain terminal of the third switching transistor, a second source/drain terminal of the second control transistor is connected with a supply voltage, and a gate terminal of the second control transistor is connected with the output terminal of the operation amplifier, wherein a first source/drain terminal of the first switching transistor is connected with the current supply circuit, a gate terminal of the first switching transistor receives the reference current enable signal, a first source/drain terminal of the first control transistor is connected with a second source/drain terminal of the first switching transistor, a second source/drain terminal of the first control transistor is connected with the first judging device, and a gate terminal of the first control transistor is connected with the output terminal of the operation amplifier, wherein a first source/drain terminal of the second switching transistor is connected with the first bit line, a gate terminal of the second switching transistor receives the cell current enable signal, and a second source/drain terminal of the second switching transistor is connected with the first source/drain terminal of the first control transistor.

6. The non-volatile memory as claimed in claim 1, wherein during a reference current sampling phase of the Mc-th storage state judging phase, the first capacitor is charged for a sample time and the first capacitor is charged to the first reference voltage by the Mc-th reference current and the close-loop enable signal is activated, so that the first reference voltage is duplicated to the second capacitor by the operation amplifier, wherein during a cell current sampling phase of the Mc-th storage state judging phase, the first capacitor is charged to the first sensed voltage by the first cell current, wherein according to the result of comparing the first reference voltage with the first sensed voltage, the operation amplifier enables or disables the first latching circuit.

7. The non-volatile memory as claimed in claim 6, wherein in a discharge period of the reference current sampling phase and a discharge period of the cell current sampling phase, the discharge enable signal is enabled, so that the first capacitor is discharged to a ground voltage.

8. The non-volatile memory as claimed in claim 6, wherein a value of the sample period divided by a capacitance of the first capacitor is inversely proportional to the Mc-th reference current.

9. A read control method for the non-volatile memory according to claim 1,
   determining a selected row of the cell array, wherein the selected row comprises n memory cells;
   setting Mc as X;
   (a) the current supply circuit providing the Mc-th reference current;
   (b) the n judging circuits sequentially receiving the Mc-th reference current and generating the corresponding reference voltages;
   (c) the n judging circuits receiving n cell currents from the n memory cells of the selected row and generating n sensed voltages;
   (d) each of the n judging circuits selectively storing Mc according to a result of comparing the corresponding sensed voltage with the corresponding reference voltage; and
   judging whether Mc is equal to 1;
   if Mc is not equal to 1, subtracting 1 from M, and performing the step (a) again; and
   if Mc is equal to 1, allowing n current control values in the n judging circuits to be stored as the n output data, and determining storage states of the n memory cells according to the n output data.

10. The read control method as claimed in claim 9, wherein the step (c) comprises sub-steps of:
    generating a latching signal according to the result of comparing the corresponding sensed voltage with the corresponding reference voltage;
    if the latching signal is activated, enabling a latching circuit to store the current control value Mc; and
    if the latching signal is not activated, disabling the latching circuit.

* * * * *